(12) United States Patent
Loubet (10) Patent No.: US 10,367,061 B1
(45) Date of Patent: Jul. 30, 2019

(54) REPLACEMENT METAL GATE AND INNER SPACER FORMATION IN THREE DIMENSIONAL STRUCTURES USING SACRIFICIAL SILICON GERMANIUM

(71) Applicant: INTERNATIONAL BUSINESS MACHINES CORPORATION, Armonk, NY (US)

(72) Inventor: Nicolas Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/941,525

(22) Filed: Mar. 30, 2018

(51) Int. Cl.

| | |
|---|---|
| H01L 27/12 | (2006.01) |
| H01L 29/06 | (2006.01) |
| H01L 29/10 | (2006.01) |
| H01L 29/66 | (2006.01) |
| H01L 29/08 | (2006.01) |
| H01L 29/78 | (2006.01) |
| H01L 29/423 | (2006.01) |
| H01L 21/3065 | (2006.01) |
| H01L 21/02 | (2006.01) |

(52) U.S. Cl.
CPC ...... *H01L 29/0673* (2013.01); *H01L 29/0847* (2013.01); *H01L 29/1037* (2013.01); *H01L 29/42392* (2013.01); *H01L 29/6656* (2013.01); *H01L 29/66545* (2013.01); *H01L 29/66795* (2013.01); *H01L 29/785* (2013.01); *H01L 21/02532* (2013.01); *H01L 21/3065* (2013.01); *H01L 29/0649* (2013.01); *H01L 29/6653* (2013.01)

(58) Field of Classification Search
CPC ............. H01L 29/0673; H01L 29/0847; H01L 29/1037; H01L 29/42392; H01L 29/66545; H01L 29/6656; H01L 29/66795; H01L 29/785; H01L 29/0649; H01L 29/6653; H01L 21/02532; H01L 21/3065
USPC ......................................................... 257/347
See application file for complete search history.

(56) References Cited

U.S. PATENT DOCUMENTS

| | | | |
|---|---|---|---|
| 9,620,590 B1 | 4/2017 | Bergendahl et al. | |
| 9,653,289 B1* | 5/2017 | Balakrishnan | ........ H01L 27/088 |
| 9,799,748 B1 | 10/2017 | Xie et al. | |
| 2017/0005188 A1 | 1/2017 | Cheng et al. | |
| 2017/0047452 A1 | 2/2017 | Kim et al. | |
| 2017/0053998 A1 | 2/2017 | Kim et al. | |
| 2017/0148900 A1 | 5/2017 | Leobandung | |
| 2017/0256611 A1* | 9/2017 | Kim | ................... H01L 29/0673 |
| 2017/0338328 A1 | 11/2017 | Wang et al. | |
| 2017/0358665 A1 | 12/2017 | Song et al. | |
| 2017/0365661 A1 | 12/2017 | Doris et al. | |

* cited by examiner

*Primary Examiner* — Tu-Tu V Ho
(74) *Attorney, Agent, or Firm* — Cantor Colburn LLP; Vazken Alexanian (57) ABSTRACT

A technique relates to a semiconductor device. Stacks are formed each of which including two or more nanosheets separated by a high-k dielectric material. The high-k dielectric material is formed on at least a center portion of the two or more nanosheets in the stacks. A lower spacer material is on a periphery of the two or more nanosheets, and an upper spacer material is on the lower spacer material such that the upper spacer material is above a top one of the two or more nano sheets. Source and drain regions are formed on sides of the stacks.

20 Claims, 7 Drawing Sheets

FIG. 1

REPLACEMENT METAL GATE AND INNER SPACER FORMATION IN THREE DIMENSIONAL STRUCTURES USING SACRIFICIAL SILICON GERMANIUM

BACKGROUND

The present invention generally relates to fabrication methods and resulting structures for semiconductor devices, and more specifically, to forming replacement metal gates and inner spacers in three dimensional semiconductor device structures using sacrificial silicon germanium.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on").

N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

The nanowire or nanosheet MOSFET is a type of MOSFET that uses multiple stacked nanowires/nanosheets to form multiple channel regions. The gate regions of a nanosheet MOSFET are formed by wrapping gate stack materials around the multiple nanowire/nanosheet channels. This configuration is known as a gate-all-around (GAA) FET structure. The nanowire/nanosheet MOSFET device mitigates the effects of short channels and reduces drain-induced barrier lowering.

SUMMARY

Embodiments of the invention are directed to a method for forming a semiconductor device. A non-limiting example of the method includes forming stacks each of which including two or more nanosheets separated by a high-k dielectric material, the high-k dielectric material being formed on at least a center portion of the two or more nanosheets in the stacks. A lower spacer material is on a periphery of the two or more nanosheets, and an upper spacer material is on the lower spacer material such that the upper spacer material is above a top one of the two or more nanosheets. The method includes forming source and drain regions on sides of the stacks.

Embodiments of the invention are directed to a method for forming a semiconductor device. A non-limiting example of the method includes forming two or more nanosheets in a stack, the two or more nanosheets being separated by a high-k dielectric material in the stack. The method includes forming an upper spacer material above a top one of the two or more nanosheets in the stack, and forming a lower spacer material at least on a periphery of the two or more nanosheets such that the lower spacer material is below the upper spacer material in the stack. Also, the method includes forming source and drain regions on sides of the stack.

Embodiments of the invention are directed to a semiconductor device. A non-limiting example of the semiconductor device includes stacks each of which including two or more nanosheets separated by a high-k dielectric material, the high-k dielectric material being formed on at least a center portion of the two or more nanosheets in the stacks. A lower spacer material is on a periphery of the two or more nanosheets, and an upper spacer material is on the lower spacer material such that the upper spacer material is above a top one of the two or more nanosheets. The semiconductor device includes source and drain regions on sides of the stacks.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, gate-all-around (GAA) nanosheet FET structures can provide superior electrostatics. In contrast to known Fin-type FET (Fin-FET) structures in which the fin element of the transistor extends "up" out of the transistor, nanosheet FET designs implement the fin as a silicon nanowire. In a known configuration of a GAA nanosheet FET, a relatively small FET footprint is provided by forming the channel region as a series of nanosheets (i.e., silicon nanowires). A known GAA configuration includes a source region, a drain region, and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

Nanosheet technology can have fin-like structures formed into the substrate in one direction, while the longitudinal direction (lengthwise direction) of the gate regions are perpendicular to the longitudinal direction (lengthwise direction). In other words, the fin-like structures perpendicularly cross the gate regions. These fin-like structures or fins formed in the substrate have a fin pitch. In nanosheet technology, it is difficult to insert a dielectric between one fin or fin-like structure to the next fin or fin-like structure when the fin/fin-like structure pitch (i.e., fin pitch) is too small. The fins or fin-like structures have nanosheets on top.

Turning now to an overview of the aspects of the invention, one or more embodiments of the invention address the above-described shortcomings of the prior art by providing a semiconductor device and a method of forming the semiconductor device. Embodiments of the invention describe the use of sacrificial silicon germanium (SiGe) material (dielectric material) to pinch off between patterned fin or fin-like structures (having similarly patterned nanosheets on top) which eases the replacement metal gate process for such a small fin pitch. Embodiments of the invention describe a modified replacement metal gate process in nanosheet or FinFET integration using sacrificial material that can be selectively etched versus silicon. Particularly, an example fabrication method according to aspects of the invention uses non-selective sacrificial SiGe to fill the cavities between patterned fin or fin-like structures having similarly patterned nanosheets on top. Additionally, embodiments of the invention describe nanosheet stacks/structures having an inner spacer at the edges of the channel and also on top of the isolation region for lower gate to source/drain capacitance and better source/drain protection during channel release in stacked nanosheet integration.

Figure 1:
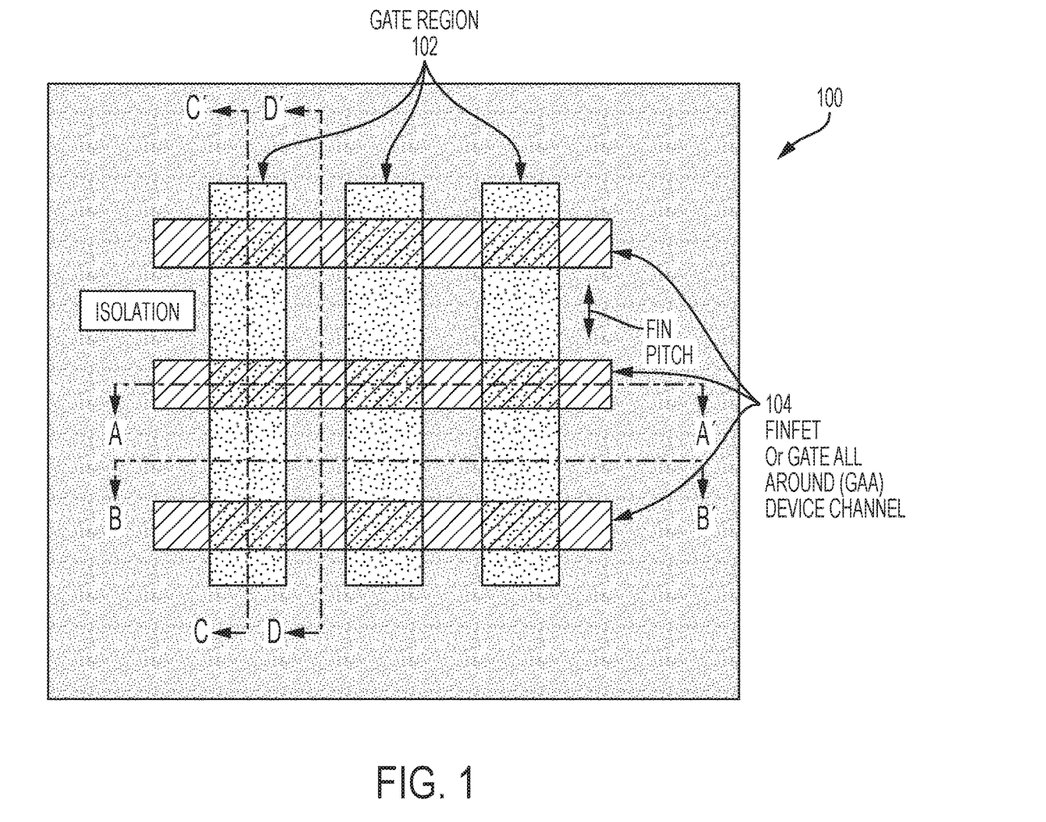
FIG. 1 depicts a simplified top view of a semiconductor device after initial fabrication operations according to embodiments of the invention.

Turning now to a more detailed description of aspects of the present invention, FIG. 1 depicts a simplified top view of a semiconductor device 100 according to embodiments of the invention. Some levels and layers have been removed so as not to obscure the figures and to more clearly show the gate regions and the source/drain regions. It should be appreciated, for example, that contacts or conductor materials are not illustrated for simplicity. In the semiconductor device 100, the gate regions 102 also referred to as gates perpendicularly intersect the finFET channels or gate-all-around device channels 104. FIG. 1 illustrates isolation regions 106, which can also be referred to as shallow trench isolation regions.

The following figures depict a process of fabricating the semiconductor device 100, and the figures include some details not illustrated in FIG. 1. The following figures depict cross-sectional views taken from various perspectives in FIG. 1 which include cross-sections views along A-A' which is across gate on active regions, B-B' which is across gates on gates on shallow isolation (STI) regions, C-C' which is across fins in gates, and D-D' which is across fins in source/drain as understood by one skilled in the art.

Figure 2A:
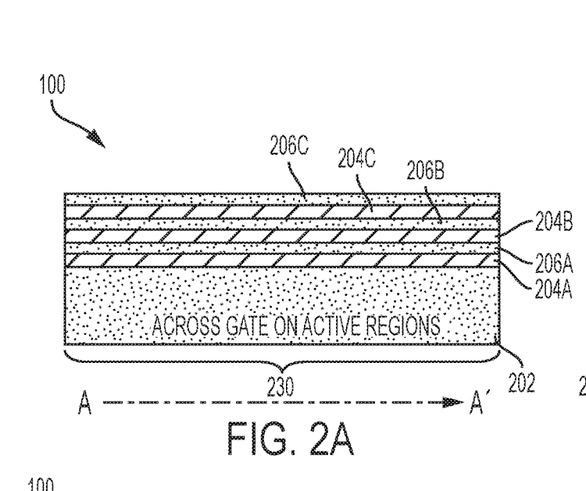
FIG. 2A depicts a cross-sectional view of the semiconductor device shown in FIG. 1 taken along line A-A' according to embodiments of the invention.
Figure 2B:
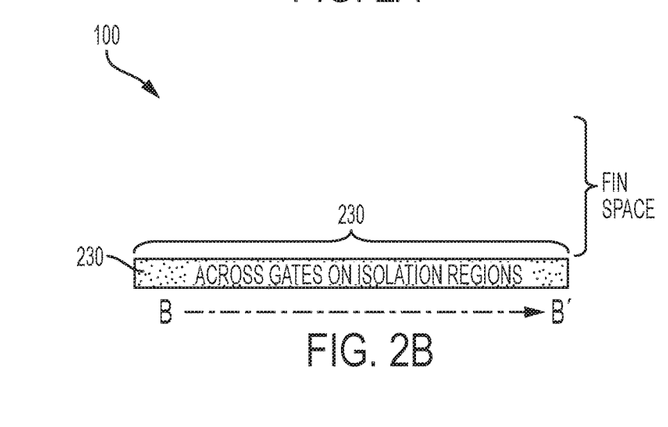
FIG. 2B depicts a cross-sectional view of the semiconductor device shown in FIG. 1 taken along line B-B' according to embodiments of the invention.
Figure 2C:
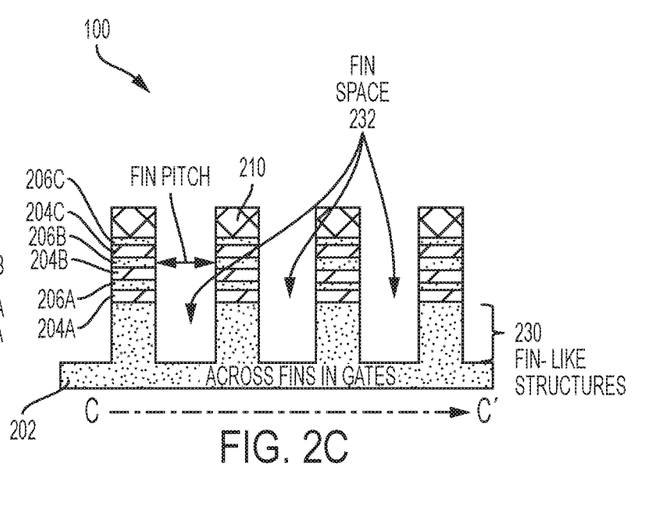
FIG. 2C depicts a cross-sectional view of the semiconductor device shown in FIG. 1 taken along line C-C' according to embodiments of the invention.
Figure 2D:
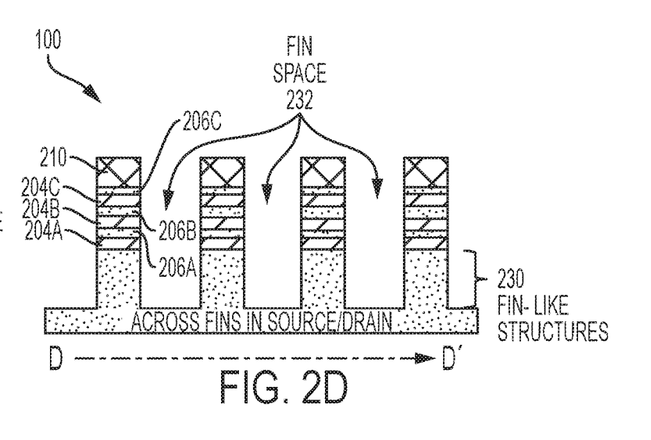
FIG. 2D depicts a cross-sectional view of the semiconductor device shown in FIG. 1 taken along line D-D' according to embodiments of the invention.

FIG. 2A depicts a cross-sectional view of the semiconductor device 100 along line A-A' according to embodiments of the invention. FIG. 2B depicts a cross-sectional view of the semiconductor device 100 along line B-B' according to embodiments of the invention. FIG. 2C depicts a cross-sectional view of the semiconductor device 100 along line C-C' according to embodiments of the invention. FIG. 2D depicts a cross-sectional view of the semiconductor device 100 along line D-D' according to embodiments of the invention. In the semiconductor device 100, nanosheets 204 and 206 are alternating layers deposited on the substrate 202. For explanation purposes, three nanosheets 204A, 204B, and 204C are illustrated, which can be referred to generally as nanosheets 204, and fewer or more than three nanosheets 204 can be utilized. Three nanosheets 206A, 206B, and 206C are illustrated, which can be referred to generally as nanosheets 206, and fewer or more than three nanosheets 206 can be utilized. The nanosheets 204 and 206 are a multilayer structure. The nanosheets 204 are sacrificial layers, and the sacrificial nanosheets 204 can be, for example, silicon germanium. The nanosheets 206 will be formed into the channels, and the nanosheets 206 can be, for example, silicon. The sacrificial nanosheets 204 can be a material that can be selectively etched with respect to the material of nanosheets 206. The nanosheets 204 and 206 are formed by a blanket deposition, and the nanosheets 204 and 206 can be epitaxially grown into the multilayer structure on the substrate 202 as understood by one skilled in the art. The repeated layers of nanosheets 204 and 206 can each have a thickness of about 2 nanometers (nm) to 20 nm. In one implementation, the thickness of each one of the nanosheets 204 and 206 is about 9 nm. The layers of nanosheets 204 and 206 can be doped or undoped. When doped, the nanosheet/nanowire layers can include "P" type dopants, or "N" type dopants. The substrate 202 can be a silicon substrate, although other materials can be used as the substrate 202. The substrate can be, for example, a silicon-on-insulator substrate.

To form fins or fin-like structures 230 into the substrate 202, the nanosheets 204 and 206 are also patterned on top of the fin-like structures. The fins or fin-like structures 230 and nanosheets 204 and 206 on top can be patterned by standard lithographic processes as understood by one skilled in the art. As one example, a hardmask material 210 is deposited on the multilayer structure of nanosheets 204 and 206. The hardmask material 210 can be a nitride, such as, for example silicon nitride. The hardmask material 210 is patterned into a predefined pattern, such that part of the multilayer structure of nanosheets 204 and 206 is covered and part is not. The patterned hardmask material 210 exposes portions of the multilayer structure of nanosheets 204 and 206 at predefined locations. The exposed portions of nanosheets 204 and 206 are etched away all the way through the substrate to create fins or fin-like structures 230 using, for example, a reactive ion etching (RIE) or another type of etch, leaving fins or fin-like structures 230 separated by trenches 232. The fins or fin-like structures 230 are seen in FIGS. 2C and 2D. The etching creates the fin pitch P between the fins or fin-like structures 230. The fin-to-fin space P is the distance between fins 230 which is the same distance between the patterned nanosheets 204 and 206 on top of the fins or fin-like structure 230 as depicted in FIGS. 2C and 2D. The fin-to-fin space P can range from about 5 nm to about 50 nm. Although 4 fins or fin-like structures 230 are shown for explanation purposes, fewer or more fins or fin-like structures are contemplated. FIG. 2A shows the multilayer structure of nanosheets 204 and 206, while FIG. 2B shows removal of the nanosheets 204 and 206.

Alternative processes for patterning the fins or fin-like structures 230 can include, for example, a sidewall image transfer process or SIT. SIT is useful for scaling purposes as it can be used to achieve sub-lithographic fin pitches. As is known in the art, SIT involves first patterning a mandrel (not shown) on the wafer, and then forming spacers (not shown) on opposite sides of the mandrel. The mandrel is removed selective to the spacers, and the spacers are used to pattern fins in the wafer. Thus, the pitch of the fins is doubled as compared to the pitch of the patterned mandrels.

Figure 3A:
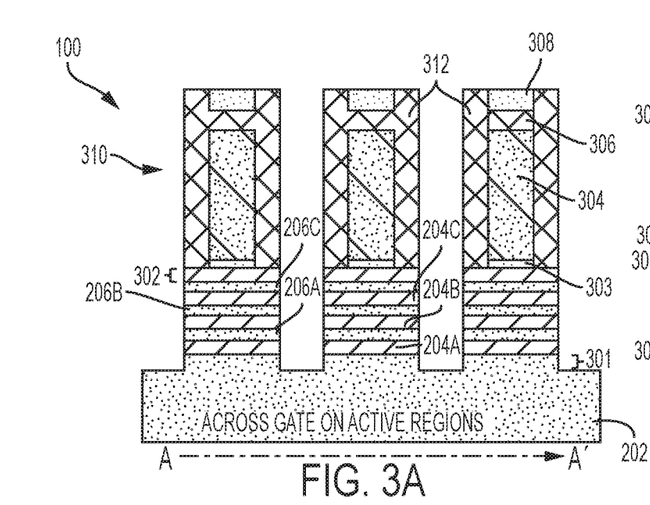
FIG. 3A depicts a cross-sectional view of the semiconductor device shown in FIG. 2A after a fabrication operation according to embodiments of the invention.
Figure 3B:
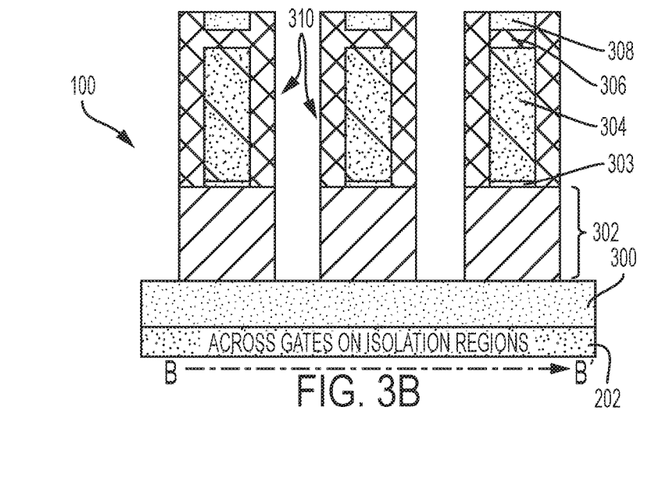
FIG. 3B depicts a cross-sectional view of the semiconductor device shown in FIG. 2B after a fabrication operation according to embodiments of the invention.
Figure 3C:
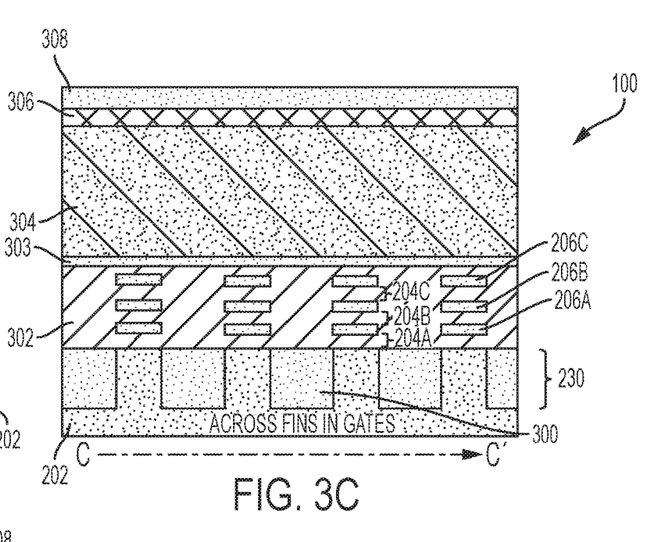
FIG. 3C depicts a cross-sectional view of the semiconductor device shown in FIG. 2C after a fabrication operation according to embodiments of the invention.
Figure 3D:
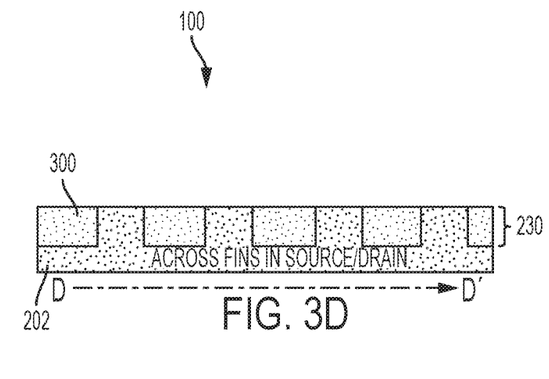
FIG. 3D depicts a cross-sectional view of the semiconductor device shown in FIG. 2D after a fabrication operation according to embodiments of the invention.

FIG. 3A depicts a cross-sectional view of the semiconductor device 100 along line A-A' according to embodiments of the invention. FIG. 3B depicts a cross-sectional view of the semiconductor device 100 along line B-B' according to embodiments of the invention. FIG. 3C depicts a cross-sectional view of the semiconductor device 100 along line C-C' according to embodiments of the invention. FIG. 3D depicts a cross-sectional view of the semiconductor device 100 along line D-D' according to embodiments of the invention.

Isolation material 300 is deposited on the semiconductor device 100. The isolation material 300 is recessed below the bottom (or bottom most) sacrificial nanosheet 204, for example, below the SiGe sacrificial layer. The isolation material 300 is a low-k dielectric material, such as, for example, a local oxide. The isolation material 300 corresponds to a shallow trench isolation (STI) region. The hardmask material 210 is removed following deposition and recess of the isolation material 300.

Non-selective sacrificial material deposition is performed. In this example, silicon germanium is the sacrificial material 302. A blanket deposit of the sacrificial material 302 is performed. FIG. 3A depicts the sacrificial material 302 formed on top of the top/uppermost nanosheet 206 (e.g., nanosheet 206C). FIG. 3B depicts the sacrificial material 302 formed on top of the bottom isolation material 300. FIGS. 3C and 3D depict the sacrificial material 302 formed on top of bottom isolation material 300 in the trenches 232 and covering the top/upper most nanosheet 206 (e.g., nanosheet 206C) in the multilayer structure.

In state-of-the-art semiconductor devices, amorphous silicon would have been deposited to fill the trenches instead of silicon germanium. However, because the fin pitch P between the fins or fin-like structures is so small, amorphous silicon does not work (or has problems) in this case. An example scenario is provided below. It is assumed that the fin-to-fin space P is 20 nm and 10 nm of the sacrificial material 302 is deposited epitaxially. The epitaxial sacrificial material 302 grows vertically in the trench 232 depicted in FIGS. 2C and 2D, and the SiGe sacrificial material 302 epitaxially grows laterally into the trench 232 from the SiGe nanosheets 204, which causes the sacrificial material 302 to pinch off for small nanosheet-to-nanosheet space or fin-to-fin space P. Particularly, the SiGe nanosheets 204 having been patterned on top of the fins 230 or fin-like structure 230 merge together in the trenches 232, thereby pinching off the trenches 232. The SiGe sacrificial material 302 forms a good seal of the trenches 232 even up above the top of the multilayer structure of nanosheets 204 and 206, all of which is in preparation for dummy gate formation. Amorphous silicon (or polysilicon) typically used in the state-of-the-art for this stage in the fabrication process does not form a good seal for the small fin-to-fin space P. Additionally, a 10 nm layer of the sacrificial material 302 is on top of the multilayer structure of nanosheets 204 and 206 in this scenario. Chemical mechanical polishing/planarization can be performed as needed. When the separation distance (e.g., fin-to-fin space P) is less than 20 nm, no chemical mechanical polishing/planarization is needed.

Moreover, amorphous silicon could not be utilized for a sub 20 nm fin pitch because it is difficult to find a gap fill amorphous silicon process that is growing vertically and not on the sidewalls to avoid the formation of voids or "key hole" if the amorphous silicon is pinched off laterally. Furthermore, it is difficult to find a process for thin conformal deposition of amorphous silicon that is growing uniformly on dielectrics.

Further regarding silicon germanium as the sacrificial material 302, the sacrificial material 302 includes an atomic percent of germanium greater than or equal to 25% (e.g., % Ge>=25%) such that atomic percent % of germanium can be 30%, 40%, 50%, 60%, or more. Additionally, the more atomic percent % Ge, the easier it is to remove the sacrificial material 302 selectively to silicon and the easier to deposit the sacrificial material 302 into the trenches 232. The sacrificial material 302 is a crystalline structure with a deposition performed at low pressure (such as, for example, from 5 Torr to 100 Torr) and moderate temperature (such as, for example, from 400° C. to 700° C.), giving the maximum mean free path to the molecules that can fill very narrow regions (i.e., narrow fin-to-fin space P) between the fins or fin-like structures 230. According to advantages and benefits of embodiments of the invention for the sacrificial material 302 used in the fin-to-fin spacer P, it would be difficult to find more suitable crystalline materials than SiGe. As lesser example materials for the sacrificial material 302, the sacrificial material 302 could include III-V materials that are crystalline and deposited at moderate temperatures, and example III-V materials could include gallium arsenide (GaAs), indium gallium arsenide (InGaAs), etc.

Dummy gate patterning is performed using stand lithographic processes. A first oxide material 303 is deposited on top of the sacrificial material 302. The oxide material 303 can be, for example, silicon dioxide (SiO$_2$). A dummy gate material 304 is deposited on top of the oxide material 303. The dummy gate material 304 can be, for example, amorphous silicon layer 304. A second hardmask material 306 is deposited on top of the dummy gate material 304. The second hardmask material 306 can be, for example, a nitride such as silicon nitride. A second oxide material 308 is deposited on top of the second hardmask material 306. The second oxide material 308 can be, for example, silicon dioxide.

Gate patterning is formed in the layers 303, 304, 306, and 308 stopping at the sacrificial material 302, to thereby form dummy gates 310 which are depicted in FIGS. 3A and 3B. As understood by one skilled in the art, a photoresist material can be deposited and exposed according to a predefined dummy gate pattern, such that the exposed portions of the photoresist material are removed leaving the second oxide material 308 exposed underneath. Accordingly, the exposed locations of layers 303, 304, 306, and 308 are etched down to the sacrificial material 302, thereby forming the dummy gates 310. The dummy gates 310 are not depicted in FIGS. 3C and 3D.

Spacer deposition and etch are performed using standard lithographic processes. A first gate spacer material 312 is deposited on the dummy gates 310. The first gate spacer material 312 is etched to leave trenches on the sides of the gate spacer material 312 in preparation for further processing. The first gate spacer material 312 is formed down to the sacrificial material 302. The first gate spacer material 312 can be, for example, a low-k dielectric material. After etching gate spacer material 312, the oxide material 308 is exposed on top of the dummy gates 310.

The regions for the source and drain are recessed using standard reaction ion etch (RIE) processes. For example, a RIE etch is performed to recess exposed portions of the sacrificial material 302, nanosheets 204, and nanosheets 206 at the locations that are not covered by the first gate spacer material 312 and second oxide material 308. The recess can continue in the substrate 202 to create a recessed portion 301 into the substrate 202 underneath multilayer structure of nanosheets 204 and 206 as depicted in FIG. 3A. FIG. 3A depicts the multilayer structure of nanosheets 204 and 206 underneath first gate spacer material 312 and second oxide material 308.

FIG. 3B is a view depicting the sacrificial material 302 remaining under the first gate spacer material 312 and second oxide material 308. FIG. 3C is a view depicting no recess in this perspective. FIG. 3D is a view depicting removal of the nanosheets 204 and 206 and the sacrificial material 302.

Figure 4A:
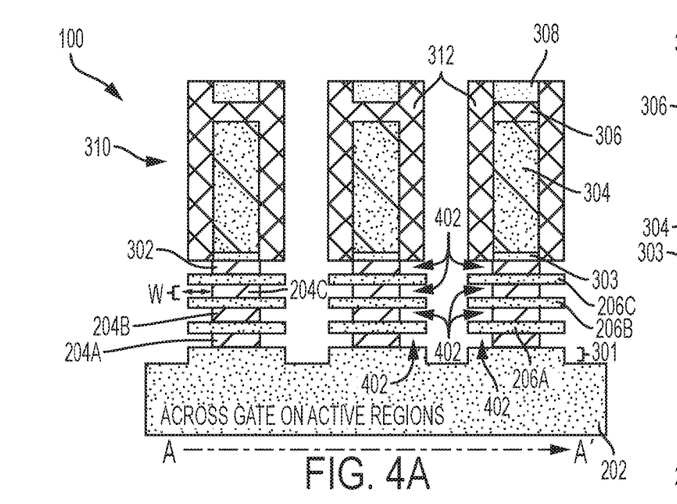
FIG. 4A depicts a cross-sectional view of the semiconductor device shown in FIG. 3A after a fabrication operation according to embodiments of the invention.
Figure 4B:
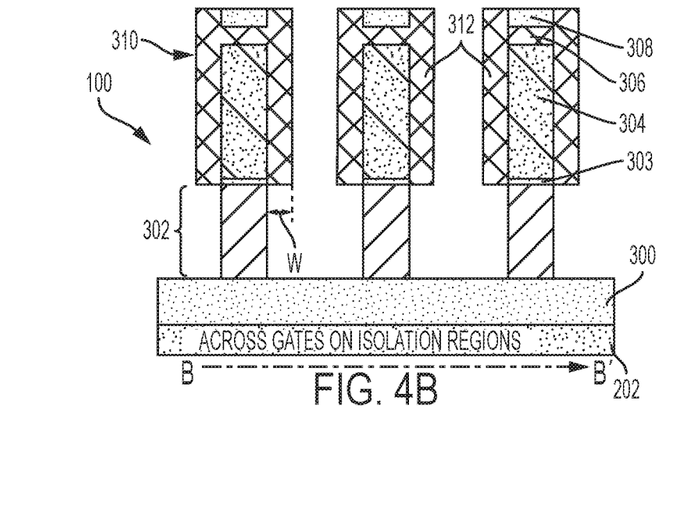
FIG. 4B depicts a cross-sectional view of the semiconductor device shown in FIG. 3B after a fabrication operation according to embodiments of the invention.
Figure 4C:
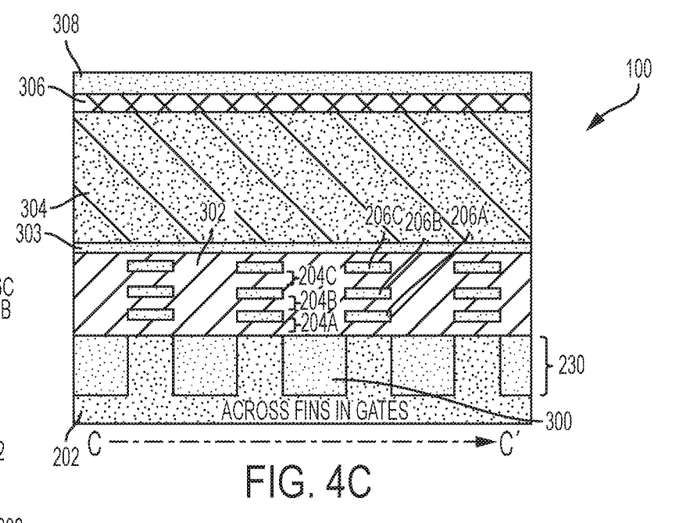
FIG. 4C depicts a cross-sectional view of the semiconductor device shown in FIG. 4C after a fabrication operation according to embodiments of the invention.
Figure 4D:
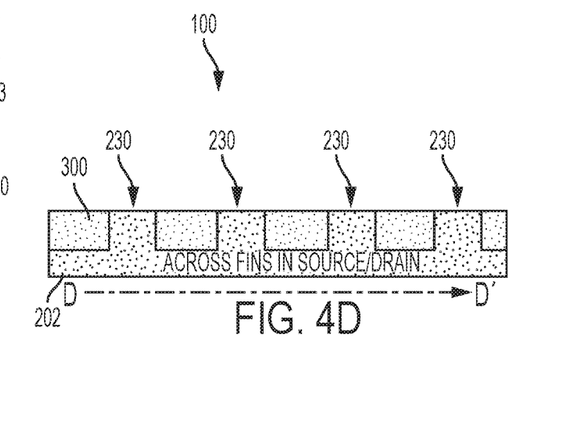
FIG. 4D depicts a cross-sectional view of the semiconductor device shown in FIG. 4D after a fabrication operation according to embodiments of the invention.

FIG. 4A depicts a cross-sectional view of the semiconductor device 100 along line A-A' according to embodiments of the invention. FIG. 4B depicts a cross-sectional view of the semiconductor device 100 along line B-B' according to embodiments of the invention. FIG. 4C depicts a cross-sectional view of the semiconductor device 100 along line C-C' according to embodiments of the invention. FIG. 4D depicts a cross-sectional view of the semiconductor device 100 along line D-D' according to embodiments of the invention. Using a standard dry or wet selective etch process, indentation is performed in the sacrificial material 302 and the nanosheets 204, for example, to laterally recess the silicon germanium material in the nanosheets 204 and sacrificial material 302.

FIG. 4A depicts indentations 402 that are formed by laterally recessing the sacrificial nanosheets 204. The indentations 402 are spaces between the nanosheets 206 which are to be the channels. The width W of the indentations 402 can range from about 4 nm to 15 nm, and this width is structured to coincide with the width of the first gate spacer material 312. FIG. 4B depicts that the sides of the sacrificial material 302 have been recessed (about) the same width of the indentations 402. As depicted in FIGS. 4A and 4B, etching of the nanosheets 204 and sacrificial material 302 can be performed concurrently because the nanosheets 204 and sacrificial material 302 are both formed of silicon germanium material. The lateral recess is not visible from the perspective in FIGS. 4C and 4D.

Figure 5A:
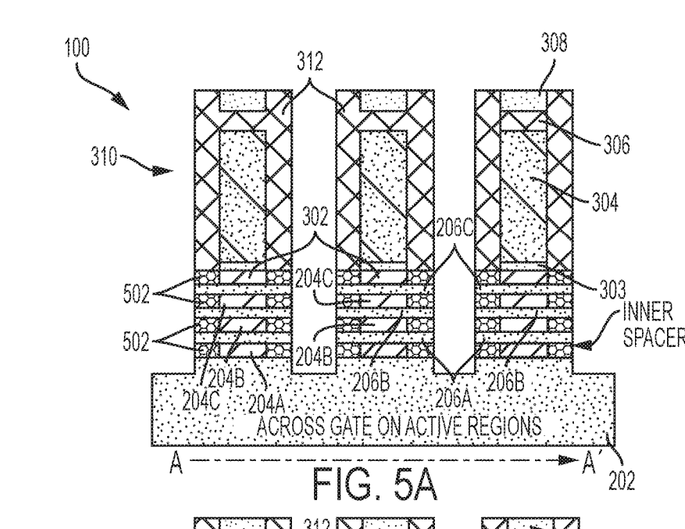
FIG. 5A depicts a cross-sectional view of the semiconductor device shown in FIG. 4A after a fabrication operation according to embodiments of the invention.
Figure 5B:
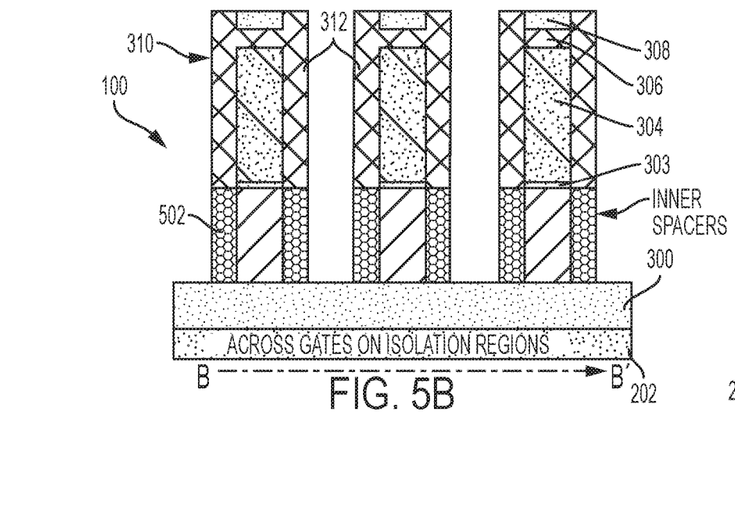
FIG. 5B depicts a cross-sectional view of the semiconductor device shown in FIG. 4B after a fabrication operation according to embodiments of the invention.
Figure 5C:
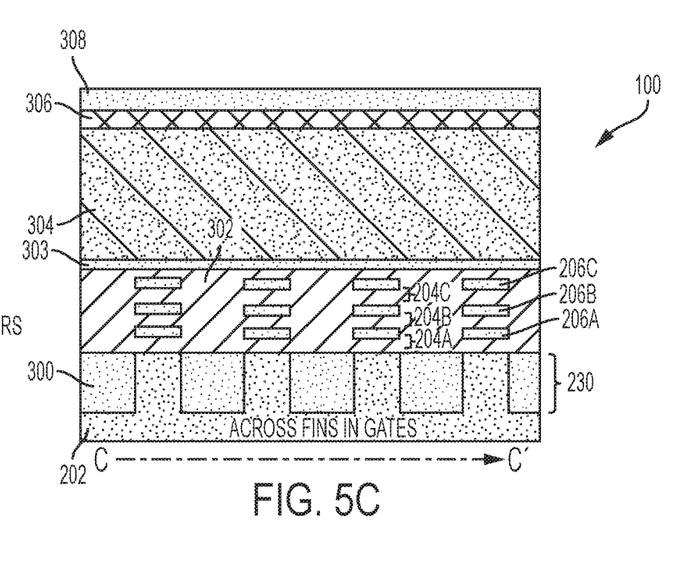
FIG. 5C depicts a cross-sectional view of the semiconductor device shown in FIG. 4C after a fabrication operation according to embodiments of the invention.
Figure 5D:
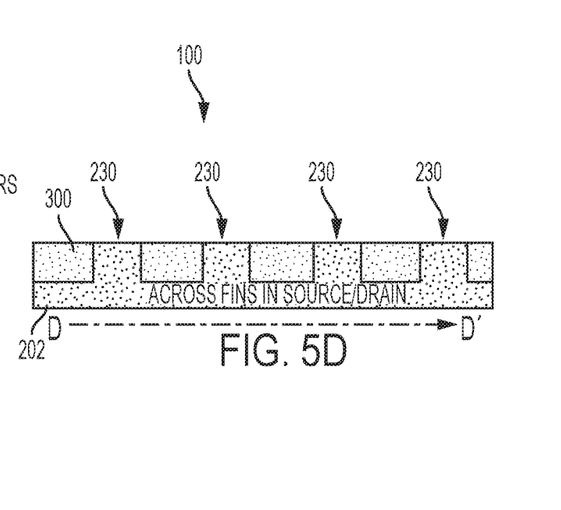
FIG. 5D depicts a cross-sectional view of the semiconductor device shown in FIG. 4D after a fabrication operation according to embodiments of the invention.

FIG. 5A depicts a cross-sectional view of the semiconductor device 100 along line A-A' according to embodiments of the invention. FIG. 5B depicts a cross-sectional view of the semiconductor device 100 along line B-B' according to embodiments of the invention. FIG. 5C depicts a cross-sectional view of the semiconductor device 100 along line C-C' according to embodiments of the invention. FIG. 5D depicts a cross-sectional view of the semiconductor device 100 along line D-D' according to embodiments of the invention. Inner spacer deposition and etch are performed using standard lithographic processes.

FIG. 5A depicts formation of the inner spacer 502 in the indentations 402 of FIG. 4A. The inner spacer 502 is on the sides of the sacrificial nanosheets 204 and in between nanosheets 206. The inner spacer 502 is the second gate spacer. The inner space 502 (i.e., second gate spacer material) is underneath the first gate spacer material 312. FIG. 5B depicts formation of the inner spacer 502 on the sides of the sacrificial material 302.

The inner spacer 502 is a low-k dielectric material or silicon nitride. The inner spacer 502 (e.g., second gate spacer material) can be a different material from the first gate spacer material 312. For example, the inner spacer 502 (e.g., second gate spacer material) can be silicon nitride while the first gate spacer material 312 can be SiBCN, SiON, SiOCN. As different materials, examples of the first gate spacer material 312 can include SiBCN, SiN, SiOCN, SiON while examples of the inner spacer 502 (e.g., second gate spacer material) can include SiN, SiBCN, SiON, SiOCN. If there happens to be an overlap in the choices for the first gate spacer material 312 and the inner spacer 502, these materials can be selected such that the materials are not the same in the semiconductor device 100.

The inner spacer 502 can be formed by depositing the inner spacer material, and then (vertically) recessing the inner spacer material. Additionally, a directional etch is performed to laterally reduce the inner spacer material, thereby leaving the inner spacer 502 protected under the first gate spacer material 312 and second hardmask material 306. The inner spacer 502 can be etched using, for example, using a standard reactive ion etching technique. The inner spacer 502 is not illustrated in the views of FIGS. 5C and 5D.

Although different materials are utilized for the inner spacer 502 (e.g., second gate spacer material) and the first gate spacer material 312, there can be an option of using the same material.

Figure 6A:
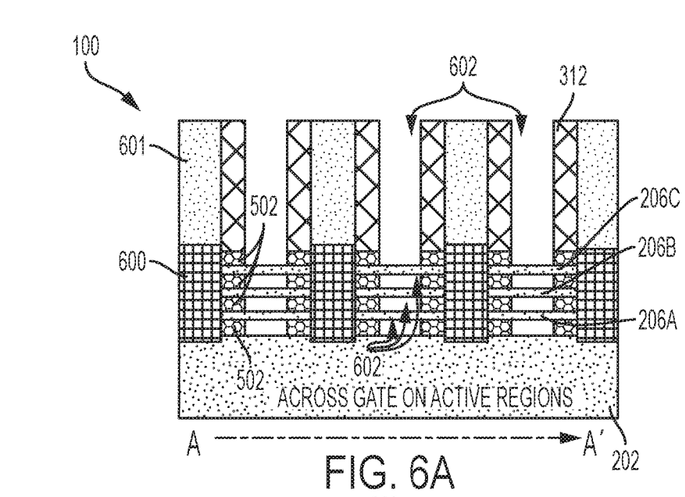
FIG. 6A depicts a cross-sectional view of the semiconductor device shown in FIG. 5A after a fabrication operation according to embodiments of the invention.
Figure 6B:
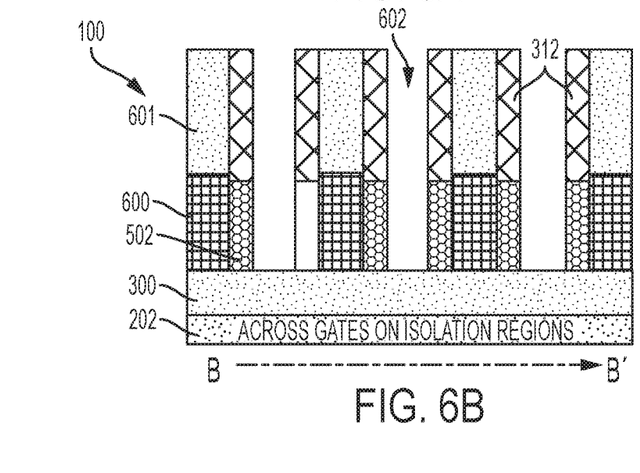
FIG. 6B depicts a cross-sectional view of the semiconductor device shown in FIG. 5B after a fabrication operation according to embodiments of the invention.
Figure 6C:
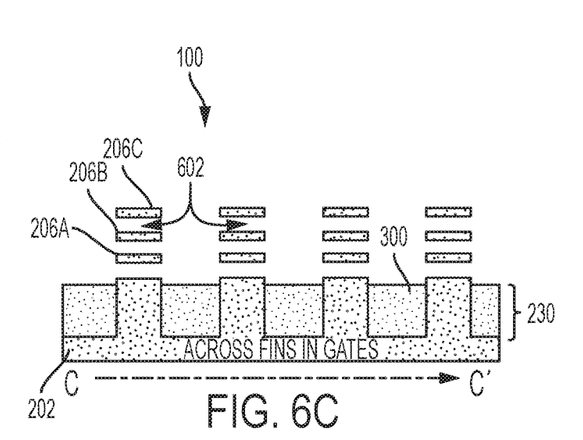
FIG. 6C depicts a cross-sectional view of the semiconductor device shown in FIG. 5C after a fabrication operation according to embodiments of the invention.
Figure 6D:
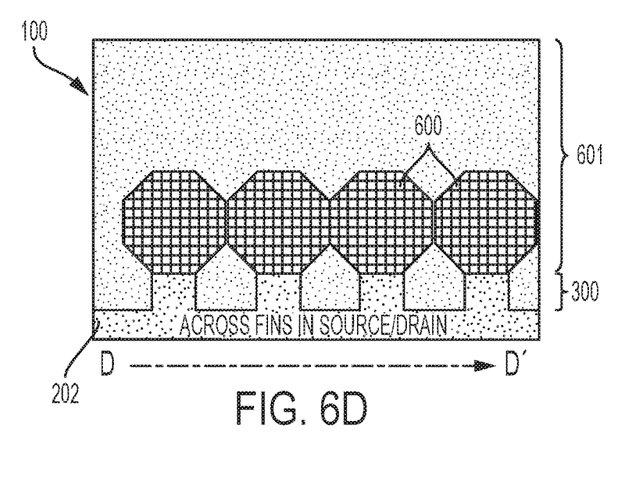
FIG. 6D depicts a cross-sectional view of the semiconductor device shown in FIG. 5D after a fabrication operation according to embodiments of the invention.

FIG. 6A depicts a cross-sectional view of the semiconductor device 100 along line A-A' according to embodiments of the invention. FIG. 6B depicts a cross-sectional view of the semiconductor device 100 along line B-B' according to embodiments of the invention. FIG. 6C depicts a cross-sectional view of the semiconductor device 100 along line C-C' according to embodiments of the invention. FIG. 6D depicts a cross-sectional view of the semiconductor device 100 along line D-D' according to embodiments of the invention. Using stand lithographic processes, junction formation of the source/drain epitaxy is formed, and the amorphous silicon (or polysilicon) is opened.

The source/drain 600 is epitaxially grown from the substrate 202 and from the nanosheets 206 (i.e., channel region). The source/drain 600 can be doped with n-type dopants to form NFET devices or doped with p-type dopants to form PFET devices. The source/drain 600 is grown up to a lower portion of the first gate spacer material 312 as depicted in FIGS. 6A and 6B. FIG. 6C does not illustrate the epitaxial layer of the source/drain 600. FIG. 6D depicts the epitaxially grown source/drain 600 from the substrate 202 and from the exposed portion of silicon 206A, 206B, 206C. FIG. 6D is an example of overgrowth of the epitaxial layer such that the source/drain 600 layers touch. Although a polygon shape is illustrated, the overgrowth can be a box shape or diamond shape.

Additionally, a third oxide material 601 is deposited on the source/drain 600 as depicted in FIGS. 6A, 6B, and 6D. The third oxide material 601 is also deposited on top of the bottom isolation 300. Chemical mechanical polishing/planarization can be performed multiple times to remove an upper part of the first gate spacer material 312, the second oxide material 308, and an upper part of the third oxide material 601, which opens the top part of the amorphous silicon 304.

After standard chemical mechanical planarization (CMP), the top amorphous silicon is exposed, amorphous silicon (polysilicon) pull down is performed, followed by removal of the first oxide material 303, nanosheets 204, and sacrificial material 302. Using standard CMP and selective etch, the replacement metal gate process is started as understood by one skilled in the art. The amorphous silicon of the dummy gate 304 is removed, i.e., pulled down, such that the first oxide material 303 is exposed in the trench created above. The amorphous silicon dummy gate material 304 can be removed using ammonia. Further, the exposed (sacrificial) first oxide material 303, the (silicon germanium) sacrificial material 302, and the silicon germanium sacrificial nanosheets 204 are removed, which leaves empty spaces 602 in the vacant locations left by removal of layers 204, 302, and 303.

In the view of FIG. 6C, the nanosheets 206 appear to be suspended in midair. However, FIG. 6A shows that the nanosheets 206 are supported by the source/drain 600 and inner spacer 502.

Figure 7A:
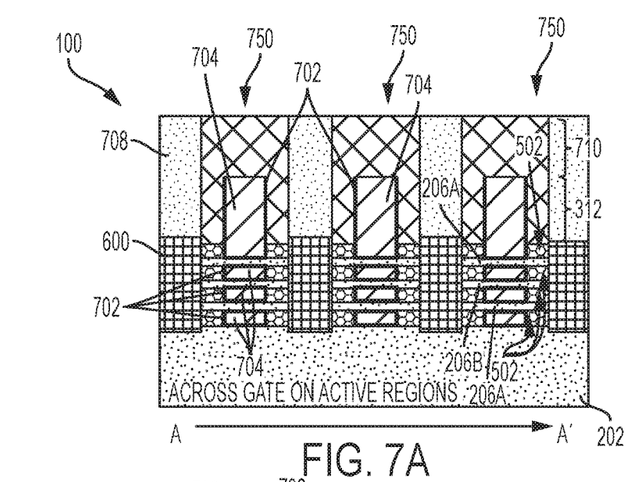
FIG. 7A depicts a cross-sectional view of the semiconductor device shown in FIG. 6A after a fabrication operation according to embodiments of the invention.
Figure 7B:
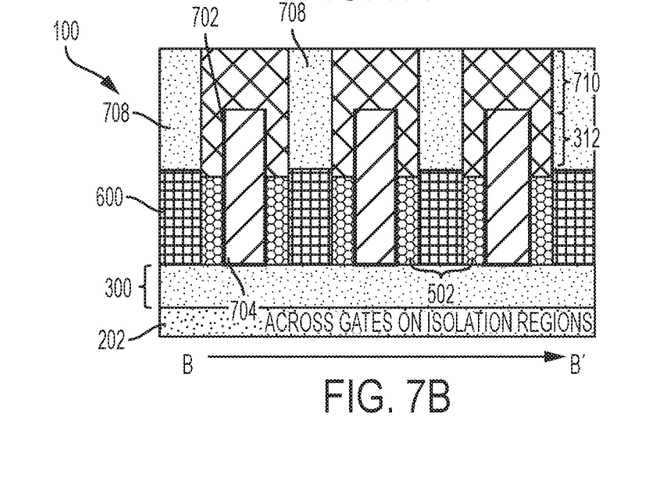
FIG. 7B depicts a cross-sectional view of the semiconductor device shown in FIG. 6B after a fabrication operation according to embodiments of the invention.
Figure 7C:
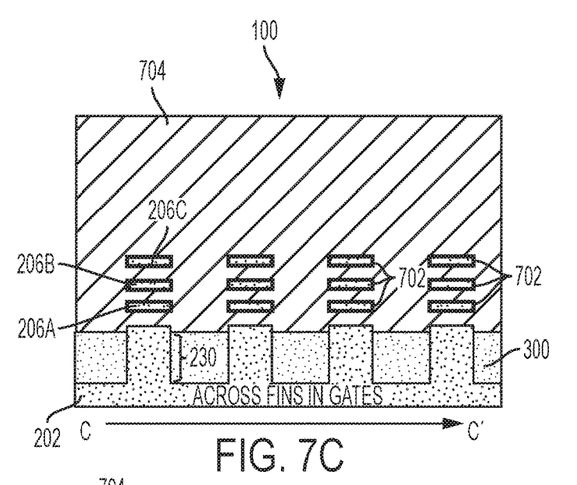
FIG. 7C depicts a cross-sectional view of the semiconductor device shown in FIG. 6C after a fabrication operation according to embodiments of the invention.
Figure 7D:
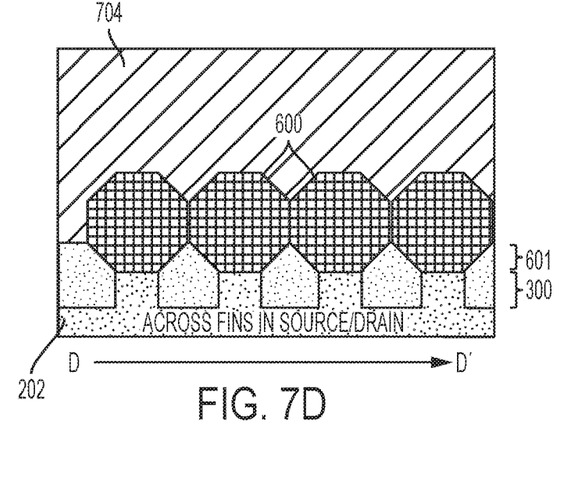
FIG. 7D depicts a cross-sectional view of the semiconductor device shown in FIG. 6D after a fabrication operation according to embodiments of the invention.

FIG. 7A depicts a cross-sectional view of the semiconductor device 100 along line A-A' according to embodiments of the invention. FIG. 7B depicts a cross-sectional view of the semiconductor device 100 along line B-B' according to embodiments of the invention. FIG. 7C depicts a cross-sectional view of the semiconductor device 100 along line C-C' according to embodiments of the invention. FIG. 7D depicts a cross-sectional view of the semiconductor device 100 along line D-D' according to embodiments of the invention. A final structure for the semiconductor device 100 is provided. Using standard deposition and lithographic processes, completion of the replacement metal gate process is performed followed by contact deposition.

In the space 602 (depicted in FIG. 6A) remaining from removal of the dummy gate material 304, a high-k dielectric material 702 is deposited to line the trench and line the nanosheets 206 (i.e., wrap around the channel). The high-k dielectric material 702 can be formed by conformal deposition techniques. The high-k dielectric material 702 can be formed by atomic layer deposition (ALD), chemical vapor deposition (CVD), physical vapor deposition (PVD), etc. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum.

A work function metal 704 is deposited to fill in the remaining space 602 (depicted in FIG. 6A) between nanosheets 206 and above the nanosheets 206, following deposition of the high-k dielectric material 702. The work function metal 704 is recessed at the top of the gate. The recessed portion is filed by a cap layer 710. The cap layer 710 can be, for example, a nitride such as silicon nitride. The work function metal 704 can include one or more different metals. Example work function metals 704 can include TiN, TiC, TiCAl, TaN, or any other metals used in the state of the art. Further processing includes removing the third oxide material 601, and metal contacts 708 are deposited in place of the third oxide material 601.

Stacks 750 are formed as depicted in FIG. 6A. The stacks 750 include at least the high-k dielectric material 702, nanosheets 206, and the work function metal 704. The stacks 750 can also include first gate spacer material 312, inner spacer 502 (e.g., second gate spacer material), and optionally cap layer 710.

A method of forming the semiconductor device 100 is provided. The method includes forming stacks 750 each of which include two or more nanosheets 206 separated by a high-k dielectric material 702, the high-k dielectric material 702 being formed on at least a center portion of the two or more nanosheets 206 in the stacks 750, wherein a lower spacer material 502 is on a periphery of the two or more nanosheets 206, wherein an upper spacer material 312 is on the lower spacer material 502 such that the upper spacer material 312 is above a top one of the two or more nanosheets 206. The method includes forming source and drain regions 600 on sides of the stacks 750.

The lower spacer material 502 and the upper spacer material 312 are different materials. The lower spacer material 502 and the upper spacer material 312 are the same materials.

The lower spacer material 502 is formed by removing a sacrificial material 302 having been formed after formation of the upper spacer material 312 and then depositing the lower spacer material 502 in a space left from removal of the sacrificial material 302. The lower spacer material 502 is formed after dummy gate (310) formation and after formation of the upper spacer material 312. The stacks 750 are formed on fin-like structures 230, the fin-like structures 230 being formed to have a fin-to fin space P. The fin-to-fin space P is about 5 to 50 nanometers. The upper spacer material 312 is formed on a portion of a sacrificial material 302, the sacrificial material 302 being formed to accommodate the fin-to fin space P. Removal of the portion of the sacrificial material 302 provides a location to form the lower spacer material 502 underneath the upper spacer material 312.

A method of forming a semiconductor device 100 is provided below. The method includes forming two or more nanosheets 206 in a stack 750, the nanosheets 206 being separated by a high-k dielectric material 702 in the stack 750, and forming an upper spacer material 312 above a top one of the two or more nanosheets 206 in the stack 750. The method includes forming a lower spacer material 502 at least on a periphery of the two or more nanosheets 206 such that the lower spacer material 502 is below the upper spacer material 312 in the stack 750, and forming source and drain regions 600 on sides of the stack 750.

The lower spacer material and the upper spacer material are different materials. The lower spacer material and the upper spacer material are the same materials.

The lower spacer material is formed by removing a sacrificial material, the sacrificial material having been formed after formation of the upper spacer material. The lower spacer material is formed after dummy gate formation and after formation of the upper spacer material. The stack is formed on fin-like structures, the fin-like structures being formed to have a defined fin-to fin space. The upper spacer material is formed on a portion of a sacrificial material, the sacrificial material being formed to accommodate the fin pitch, and removal of the portion of the sacrificial material provides a location to form the lower spacer material underneath the upper spacer material. The fin-to fin space is about 5 to 50 nanometers.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming stacks each of which including two or more nanosheets separated by a high-k dielectric material, the high-k dielectric material being formed on at least a center portion of the two or more nanosheets in the stacks, wherein a lower spacer material is on a periphery of the two or more nanosheets, wherein the lower spacer material is on a top surface of an upper most nanosheet of the two or more nanosheets, wherein an upper spacer material is directly on the lower spacer material such that the upper spacer material is above a top one of the two or more nanosheets; and
    forming source and drain regions on sides of the stacks.

2. The method of claim 1, wherein the lower spacer material and the upper spacer material are different materials.

3. The method of claim 1, wherein the lower spacer material and the upper spacer material are the same materials.

4. The method of claim 1, wherein the lower spacer material is formed by removing a sacrificial material having been formed after formation of the upper spacer material and depositing the lower spacer material in a space left from removal of the sacrificial material.

5. The method of claim 1, wherein the lower spacer material is formed after dummy gate formation and after formation of the upper spacer material.

6. The method of claim 1, wherein the stacks are formed on fin-like structures, the fin-like structures being formed to have a fin pitch, the fin-like structures having been formed in a substrate.

7. The method of claim 6, wherein the fin pitch is about 5 to 50 nanometers.

8. The method of claim 6, wherein the upper spacer material is formed on a portion of a sacrificial material, the sacrificial material being formed to accommodate the fin pitch.

9. The method of claim 8, wherein removal of the portion of the sacrificial material provides a location to form the lower spacer material underneath the upper spacer material.

10. A method of forming a semiconductor device, the method comprising:

forming two or more nanosheets in a stack, the two or more nanosheets being separated by a high-k dielectric material in the stack;

forming an upper spacer material above a top one of the two or more nanosheets in the stack;

forming a lower spacer material at least on a periphery of the two or more nanosheets such that the lower spacer material is below the upper spacer material in the stack, wherein the lower spacer material is on a top surface of an upper most nanosheet of the two or more nanosheets, wherein the upper spacer material is directly on the lower spacer material; and forming source and drain regions on sides of the stack.

11. The method of claim 10, wherein the lower spacer material and the upper spacer material are different materials.

12. The method of claim 10, wherein the lower spacer material and the upper spacer material are the same materials.

13. The method of claim 10, wherein the lower spacer material is formed by removing a sacrificial material having been formed after formation of the upper spacer material and depositing the lower spacer material in a space left from removal of the sacrificial material.

14. The method of claim 10, wherein the lower spacer material is formed after dummy gate formation and after formation of the upper spacer material.

15. The method of claim 10, wherein the stack is formed on fin-like structures, the fin-like structures being formed to have a fin pitch.

16. The method of claim 15, wherein:

the upper spacer material is formed on a portion of a sacrificial material, the sacrificial material being formed to accommodate the fin pitch; and removal of the portion of the sacrificial material provides a location to form the lower spacer material underneath the upper spacer material.

17. The method of claim 16, wherein the fin pitch is about 5 to 50 nanometers.

18. A semiconductor device comprising:

stacks each of which including two or more nanosheets separated by a high-k dielectric material, the high-k dielectric material being formed on at least a center portion of the two or more nanosheets in the stacks, wherein a lower spacer material is on a periphery of the two or more nanosheets, wherein the lower spacer material is on a top surface of an upper most nanosheet of the two or more nanosheets, wherein an upper spacer material is directly on the lower spacer material such that the upper spacer material is above a top one of the two or more nanosheets; and source and drain regions on sides of the stacks.

19. The semiconductor of claim 18, wherein the lower spacer material and the upper spacer material are different materials.

20. The semiconductor of claim 18, wherein the lower spacer material and the upper spacer material are the same materials.

* * * * *